(12) United States Patent
Seo

(10) Patent No.: US 10,374,066 B2
(45) Date of Patent: Aug. 6, 2019

(54) FIN AND SHALLOW TRENCH ISOLATION REPLACEMENT TO PREVENT GATE COLLAPSE

(71) Applicant: International Business Machines Corporation, Armonk, NY (US)

(72) Inventor: Soon-Cheon Seo, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/646,349

(22) Filed: Jul. 11, 2017

(65) Prior Publication Data
US 2019/0019877 A1    Jan. 17, 2019

(51) Int. Cl.
| H01L 29/66 | (2006.01) |
| H01L 21/8234 | (2006.01) |
| H01L 27/088 | (2006.01) |
| H01L 29/06 | (2006.01) |

(52) U.S. Cl.
CPC .. H01L 29/6681 (2013.01); H01L 21/823431 (2013.01); H01L 21/823481 (2013.01); H01L 27/0886 (2013.01); H01L 29/0653 (2013.01)

(58) Field of Classification Search
CPC .............. H01L 29/6681; H01L 29/0653; H01L 21/823431; H01L 21/283481; H01L 27/0886
See application file for complete search history.

(56) References Cited

U.S. PATENT DOCUMENTS

| 7,247,908 B2 | 7/2007 | Anderson et al. |
| 7,312,129 B2 | 12/2007 | Goktepeli et al. |
| 7,923,337 B2 | 4/2011 | Chang et al. |
| 8,637,359 B2 | 1/2014 | Chang et al. |
| 8,658,536 B1 * | 2/2014 | Choi ..................... H01L 21/308 257/E21.409 |

(Continued)

OTHER PUBLICATIONS

Chen, C., et al., "A Patterned Dialectic Support Process for High Performance Passive Fabrication", IEEE Microwave and Wireless Components Letters, Feb. 2008, pp. 82-84, vol. 18, No. 2.

(Continued)

*Primary Examiner* — Christine A Enad
(74) *Attorney, Agent, or Firm* — Fleit Gibbons Gutman Bongini Bianco PL; Thomas S. Grzesik (57) ABSTRACT

A semiconductor structure and a method for fabricating the same. The structure includes a substrate, active fin structures, and non-active fin structures. The structure further includes isolation regions in contact with the active fin structures, and isolation regions in contact with the non-active fin structures. A first gate structure is in contact with the active fin structures and the isolation regions that are in contact with the active fin structures. A second gate structure is in contact with the non-active fin structures. The method includes forming an isolation region between fin structures. A mask is formed over active fin structures and dummy fin structures are then removed to form a plurality of trenches between the isolation regions. A nitride-based layer is formed in contact with isolation regions corresponding to the dummy fin structures. The nitride-based layer forms a non-active fin structure within each trench of the trenches.

12 Claims, 11 Drawing Sheets (56) References Cited

U.S. PATENT DOCUMENTS

| | | | |
|---|---|---|---|
| 8,697,515 B2* | 4/2014 | Yin | H01L 21/823821 |
| | | | 438/239 |
| 8,753,953 B1 | 6/2014 | Cheng et al. | |
| 8,946,829 B2 | 2/2015 | Wann et al. | |
| 8,993,417 B2 | 3/2015 | Tsai et al. | |
| 9,324,843 B2 | 4/2016 | Balakrishnan et al. | |
| 9,449,881 B1* | 9/2016 | Sung | H01L 21/823431 |
| 2013/0065326 A1* | 3/2013 | Sudo | H01L 27/228 |
| | | | 438/3 |
| 2015/0060959 A1 | 3/2015 | Lin et al. | |
| 2017/0294356 A1* | 10/2017 | Yeh | H01L 21/823481 |
| 2017/0338225 A1* | 11/2017 | Ching | H01L 27/0886 |

OTHER PUBLICATIONS

Yamashita, T., et al., "A Novel ALD SiBCN Low-k Spacer for Parasitic Capacitance Reduction in FinFETs", 2015 Symposium on VLSI Technology Digest of Technical Papers, Jun. 17-19, 2015, pp. 1-2.

\* cited by examiner

FIN AND SHALLOW TRENCH ISOLATION REPLACEMENT TO PREVENT GATE COLLAPSE

BACKGROUND

The present invention generally relates to semiconductor devices, and more particularly relates to preventing gate collapse during fabrication of semiconductor devices.

In many instances, fabrication processes for fin field-effect-transistors (finFETs) utilize flowable oxide in the shallow trench isolation (STI) area to ensure STI oxide gap fill. Flowable oxide is generally a poor quality material and causes severe undercutting in the STI areas during CMOS dual epitaxy processes. The undercutting typically causes high aspect ratio gates to collapse.

SUMMARY OF THE INVENTION

In one embodiment, a method for forming a semiconductor structure is provided. The method comprises forming an isolation region between each fin structure of a plurality of fin structures. Each isolation region comprises an isolation material. A mask is formed over active fin structures of the plurality of fin structures. Dummy fin structures of the plurality of fin structures remain exposed. The dummy fin structures are removed to form a plurality of trenches between the isolation regions corresponding to the dummy fin structures. A nitride-based layer is formed in contact with the isolation regions corresponding to the non-active fin structures. The nitride-based layer forms a non-active fin structure within each trench of the plurality of trenches.

In another embodiment, a semiconductor structure is provided. The semiconductor structure comprises a substrate, a plurality of active fin structures, and a plurality of non-active fin structures. The structure further comprises a first plurality of isolation regions in contact with the plurality of active fin structures, and a second plurality of isolation regions in contact with the plurality of non-active fin structures. A first gate structure is in contact with the plurality of active fin structures and the first plurality of isolation regions. A second gate structure is in contact with the plurality of non-active fin structures.

In a further embodiment, an integrated circuit is provided. The integrated circuit comprises a semiconductor structure. The semiconductor structure comprises a substrate, a plurality of active fin structures, and a plurality of non-active fin structures. The structure further comprises a first plurality of isolation regions in contact with the plurality of active fin structures, and a second plurality of isolation regions in contact with the plurality of non-active fin structures. A first gate structure is in contact with the plurality of active fin structures and the first plurality of isolation regions. A second gate structure is in contact with the plurality of non-active fin structures.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

It is to be understood that the present disclosure will be described in terms of a given illustrative architecture; however, other architectures, structures, substrate materials and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Referring now to the drawings in which like numerals represent the same or similar elements, FIGS. 1-9C illustrate various processes for fabricating a semiconductor device. In general, the figures comprise a plain view and various cross-sectional views that are taken where indicated in the plain view. More specifically, the views "A" and "B" are taken along a line that passes through a fin, while view "C" is a cross-section view that is taken transverse to the long axis of the fins. It should be noted that one or more embodiments are not limited to the processes discussed below for forming the initial fin structures, gate structures, and completing the device(s) the device. This discussion is provided for illustration purposes, and any process for fabricating the initial fin structures, gate structures, and for completing the finFET device(s) is applicable to embodiments of the present disclosure.

Figure 1:
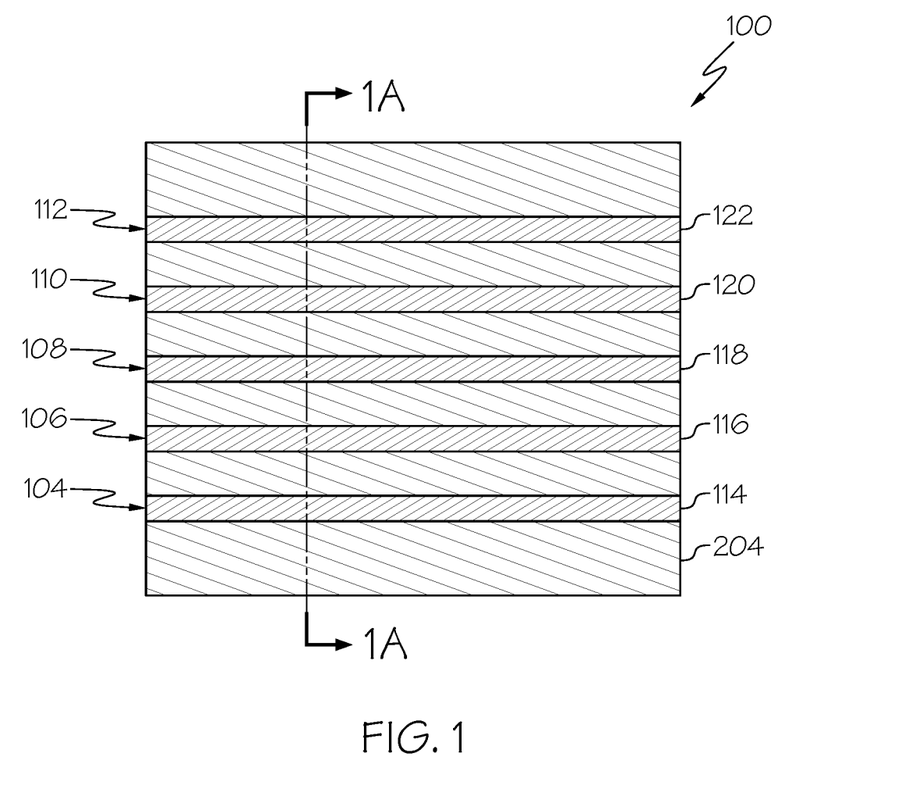
FIG. 1 is a top-down view of an initial semiconductor structure according one embodiment of the present invention.
Figure 1A:
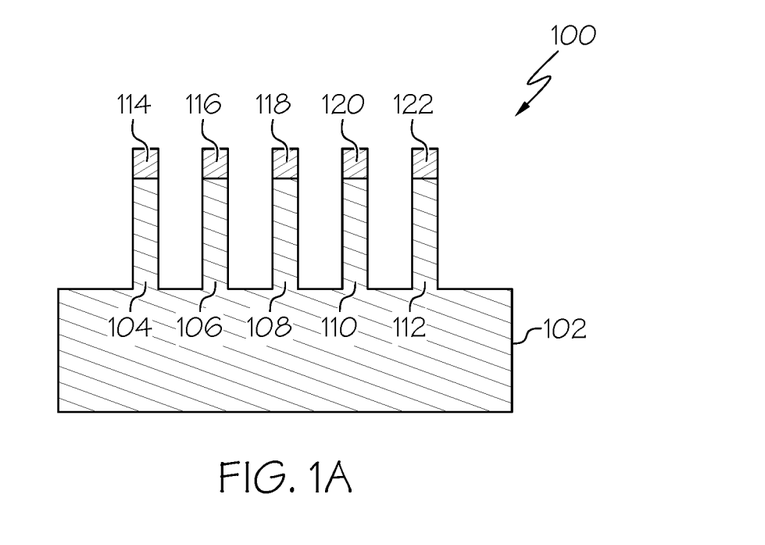
FIG. 1A is a cross-sectional view of the initial semiconductor structure comprising fin structures according one embodiment of the present invention.

As will be discussed in greater detail below, embodiments of the present invention prevent collapsing of gate structures during fabrication of finFETs and further provide semiconductor structures with high aspect ratio gates. FIG. 1 and FIG. 1A show an initial semiconductor structure 100. In one embodiment, the semiconductor structure 100 comprises a semiconductor substrate 102 and a plurality of fin structures 104 to 112. The substrate 102 may be a bulk substrate, a multilayer substrate, or a semiconductor on insulator (SOI) substrate. Examples of semiconductor substrate materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide.

The fin structures 104 to 112 are formed by patterning the semiconductor substrate 102, semiconductor layer of a multilayer substrate, or the semiconductor layer of a SOI substrate. For example, a hard mask layer is formed on the substrate or separate semiconductor layer through, for example, deposition. The hard mask layer or etch-stop capping layer, in one embodiment, may comprise silicon-nitride although other material suitable in providing etch-stop function may be used as well. One or more fin structures 104 to 112 are subsequently formed or etched out of the substrate or semiconductor layer through a process involving masking, using industry-standard lithographic techniques, and directionally etching (e.g., a reactive-ion-etching (RIE)) the semiconductor layer underneath the hard mask layer. After the RIE etching process, the photo-resist mask used in the lithographic etching process may be removed, leaving the fin structures 104 to 112 each with a hard mask cap 114 to 122. If the substrate is a multilayer or SOI substrate, the semiconductor layer is patterned down to the substrate or the insulating layer. As will be discussed below, at least a portion of the fin structures 104 to 112 is a dummy feature that will be removed during subsequent processing operations. Also, embodiments of the present invention are not limited to the number of fins shown.

Figure 2:
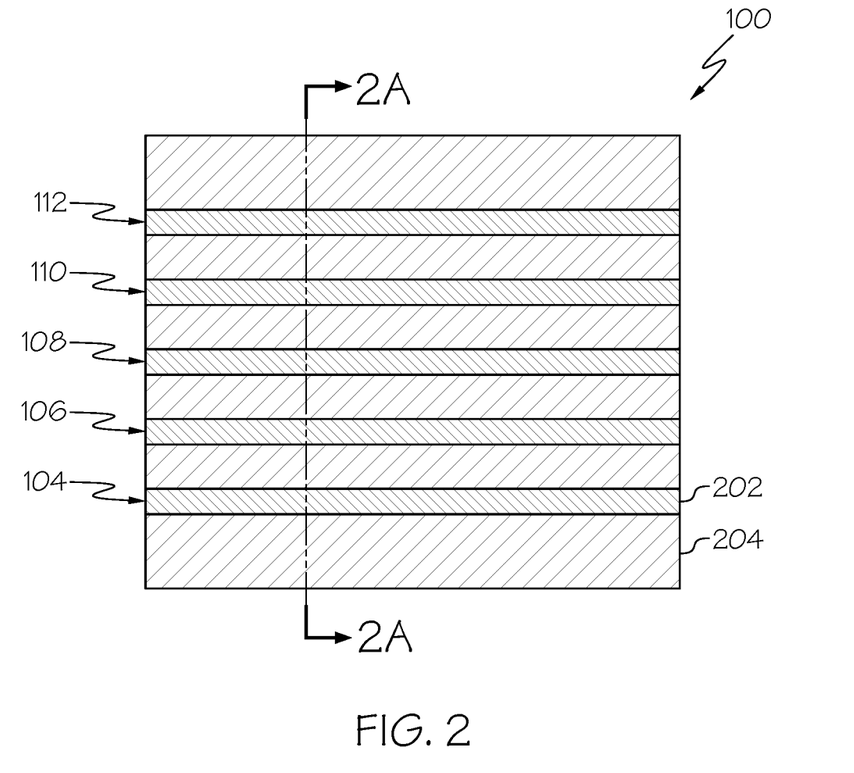
FIG. 2 is a top-down view of the semiconductor structure after a shallow trench isolation (STI) liner has been formed and STI material has been deposited according one embodiment of the present invention.
Figure 2A:
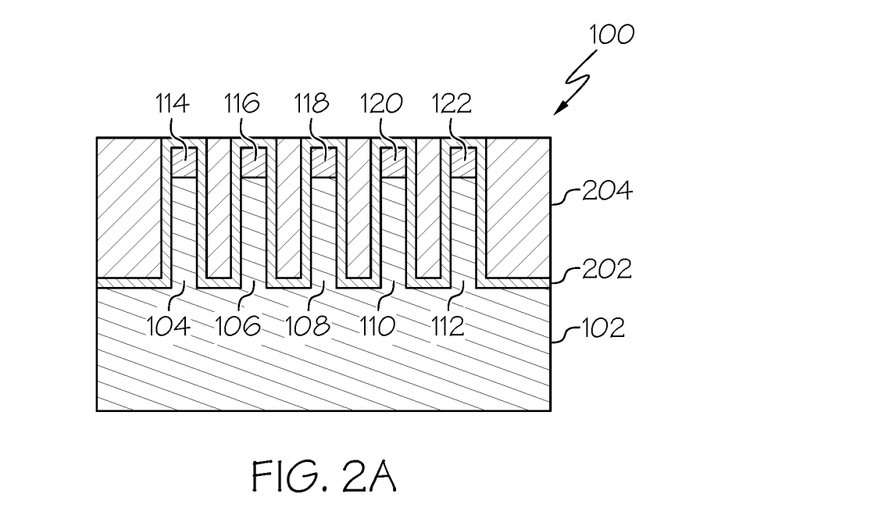
FIG. 2A is a cross-sectional view of the semiconductor structure after a shallow trench isolation (STI) liner has been formed and STI material has been deposited according one embodiment of the present invention.

After the fin structures 104 to 112 have been formed, a shallow trench isolation (STI) liner 202 is formed over and in contact with the substrate 102, the fins 104 to 112, and the hard mask caps 114 to 122, as shown in FIGS. 2 and 2A. The STI liner 202 may have a thickness ranging from, for example, about 4 nm to about 8 nm. In some embodiments, the STI liner 202 is deposited via chemical vapor deposition (CVD). In other embodiments, the STI liner 202 is deposited via atomic layer deposition (ALD). An STI material 204 is then deposited over the entire structure 100 and polished/planarized down to the STI liner 202. The STI material 204 may be comprised of oxide, and may be deposited via chemical vapor deposition (CVD), or a high-density plasma (HDP) technique. The planarization, if performed, may be performed via a chemical mechanical polish (CMP) process.

Figure 3:
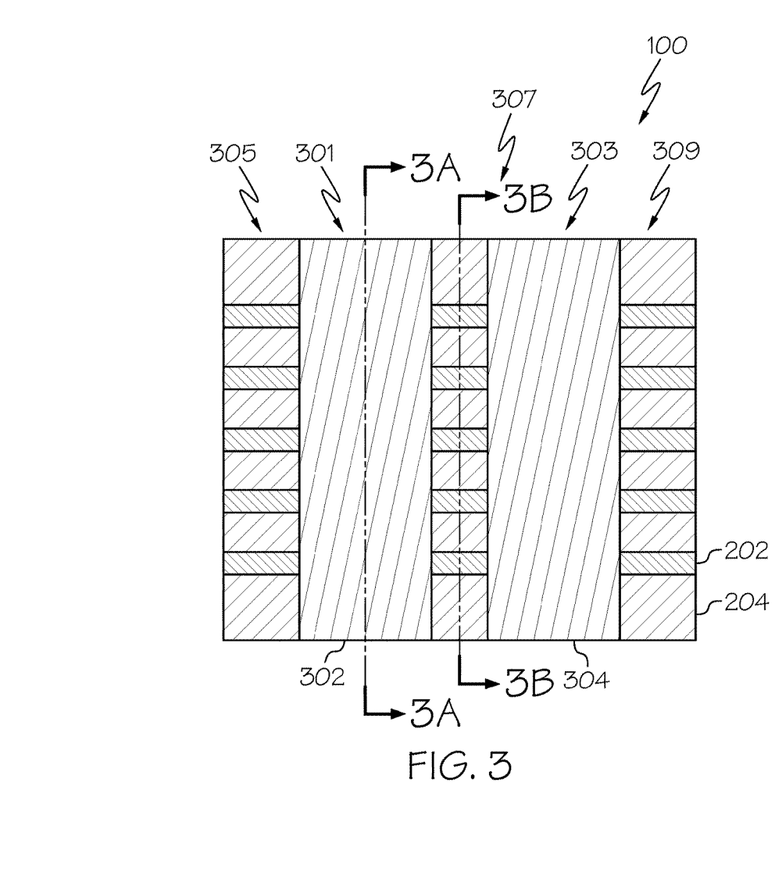
FIG. 3 is a top-down view of the semiconductor structure after active fin regions have been masked-off according one embodiment of the present invention.
Figure 3A:
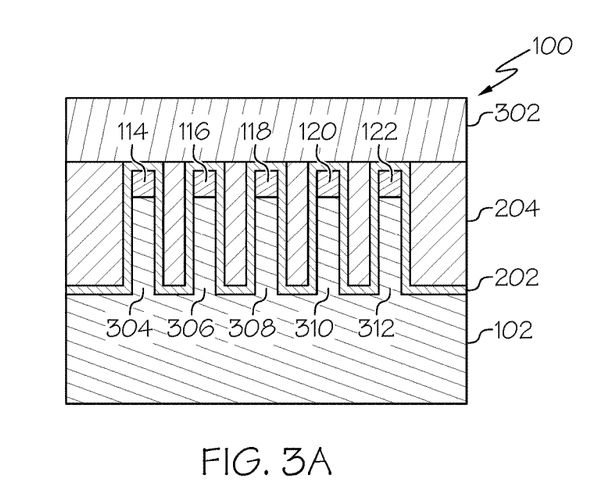
FIGS. 3A and 3B are cross-sectional views of the semiconductor structure after active fin regions have been masked-off according one embodiment of the present invention.
Figure 3B:
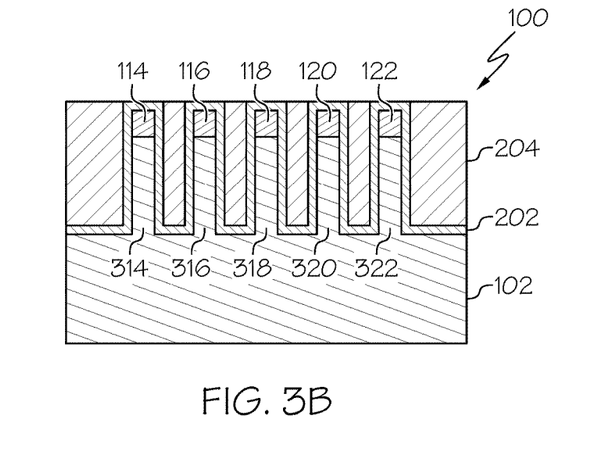

One or more areas 301, 303 of the structure 100 are then masked off, as shown in FIGS. 3 to 3B. For example, a masking material (photoresist stack) is patterned over the structure and patterned using lithographic techniques to form masks 302, 304 over areas of the 301, 303 of the structure 100 comprising portions of the fin structures 104 to 112 that will later become active fins. These portions of the fin structures 104 to 112 are herein referred to as "active fins 304 to 312". The remaining areas 305, 307, 309 of the structure 100 are left unmasked since they comprises portions of the fin structures 104 to 112 (herein referred to as "dummy fins 314 to 322" or "non-active fines 314 to 322") that will be subsequently removed.

Figure 4:
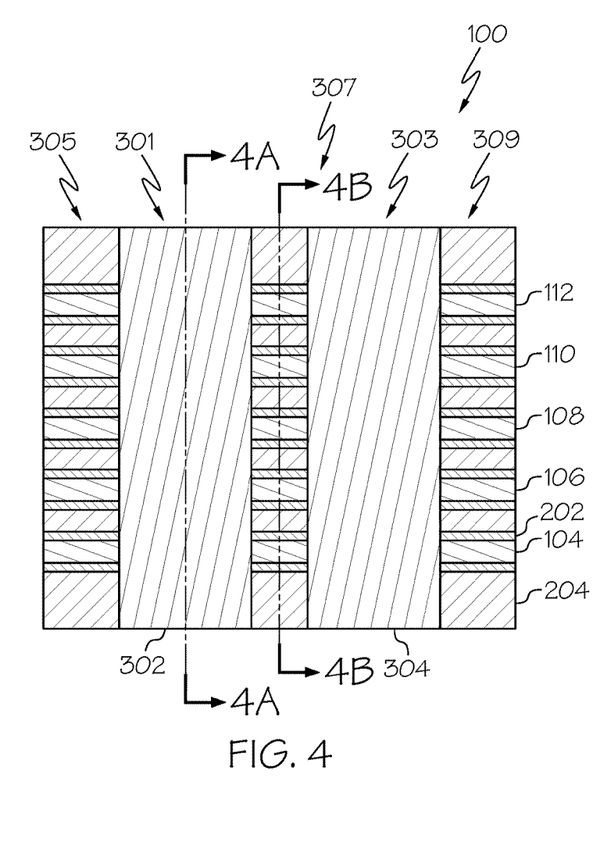
FIG. 4 is a top-down view of the semiconductor structure after a portion of dummy fin structures have been exposed according one embodiment of the present invention.
Figure 4A:
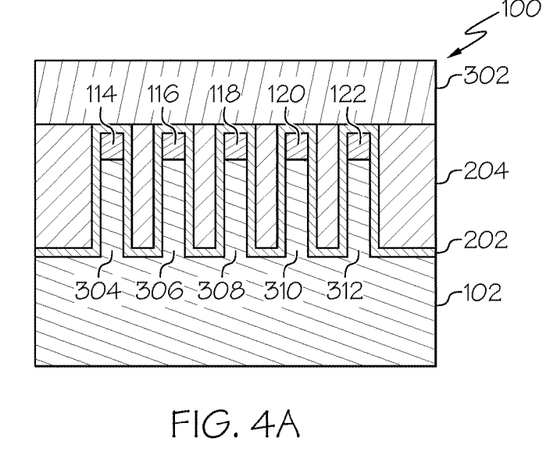
FIGS. 4A and 4B are cross-sectional views of the semiconductor structure after a portion of dummy fin structures have been exposed according one embodiment of the present invention.
Figure 4B:
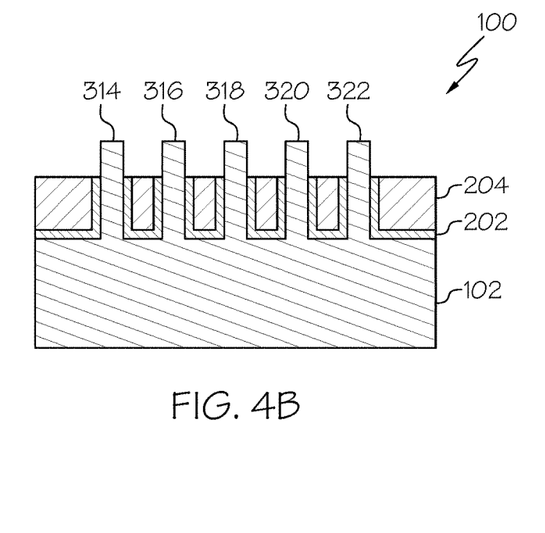

In at least some embodiments, the unmasked areas 305, 307, 309 of the structure 100 correspond to areas where fins are typically cut. However, instead of cutting fins one or more embodiments replace the dummy fins 314 to 322 with nitride-based fins to interlock with subsequently formed gate. This prevents gate collapse and floating gate issues in these areas. For example, FIGS. 4 to 4B show that after the photoresist masks 302, 304 have been formed, one or more etching process such as RIE are performed to etch down the STI liner 202 and the STI material 204, and to further remove the hard mask caps 114 to 122 in the unmasked areas 305, 307, 309 of the structure 100. The STI liner 202 and the STI material 204 are etched selective to the fin structures 104 to 112. The etching process(es) exposes a top surface and a portion of the sidewalls of the fin structures 104 to 112 in the unmasked areas 305, 307, 309 of the structure 100. In one non-limiting example, the STI liner 202 and the STI material 204 are etched down 30-80 nm. The STI liner 202 and the STI material 204 may be etched separately or together by, for example, dry plasma etching and/or in combination with wet etching.

Figures 5, 5A, 5B:
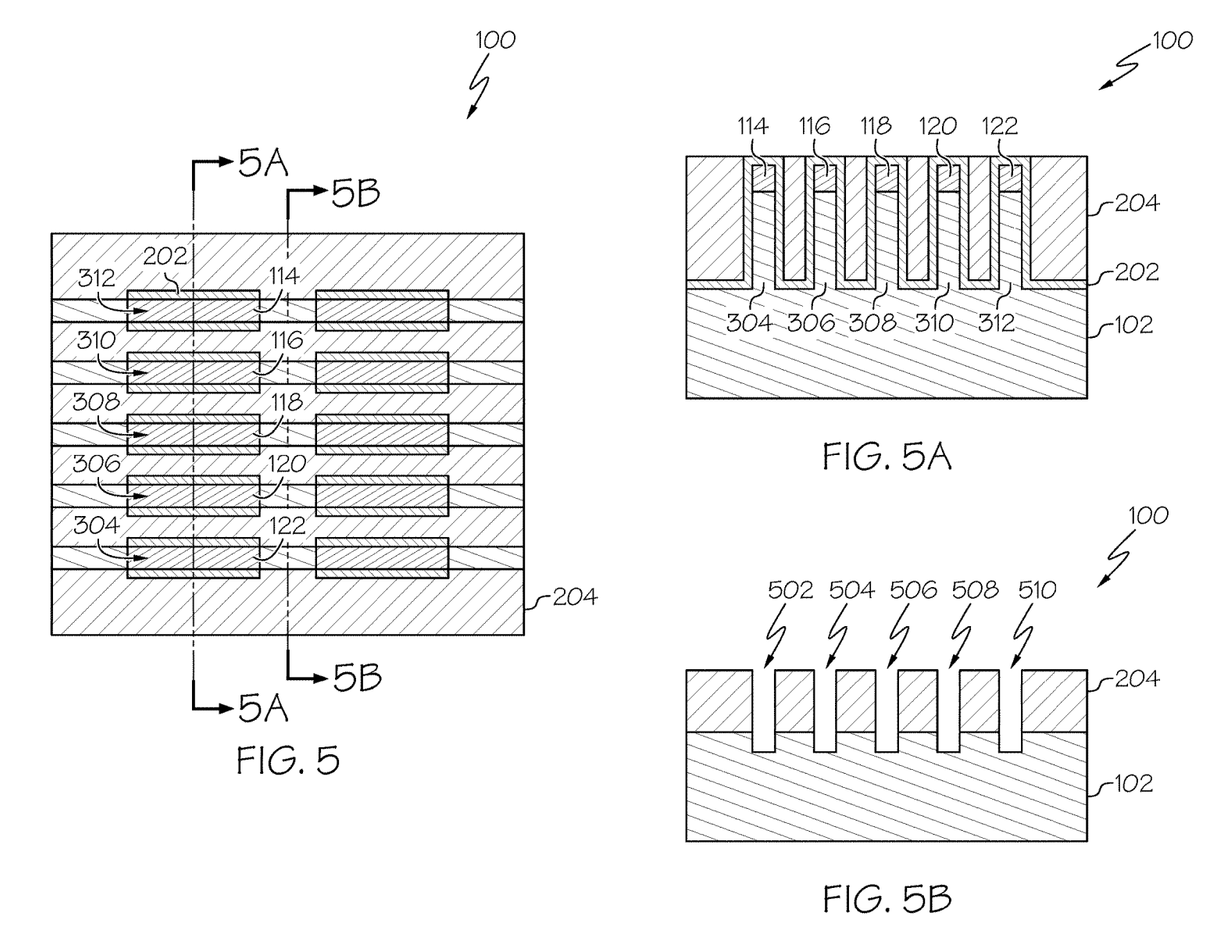
FIG. 5 is a top-down view of the semiconductor structure after the dummy fin structures have been removed according one embodiment of the present invention.
FIGS. 5A and 5B are cross-sectional views of the semiconductor structure after the dummy fin structures have been removed according one embodiment of the present invention.

The dummy fins 314 to 322 and any remaining STI liner 202 are then removed via selective etching or other techniques, as shown in FIGS. 5 to 5B. This process creates trenches 502 to 510 in place of the dummy fins 314 to 322. The trenches 502 to 510 extend below a top surface of the substrate 102 thereby creating pillars under the STI material 204. Once the dummy fins 314 to 322 have been removed, photoresist stack masks 302, 304 are removed by, for example, a dry ashing strip process or by wet strip process with a sulfuric peroxide based chemistry. This process exposes a top surface of the STI liners 202 and STI material 204 in the active fin regions 301, 303 of the structure 100. It should be noted the photoresist block masks 302, 304 may be removed prior to the dummy fins 314 to 322 being removed.

Figures 6, 6A, 6B:
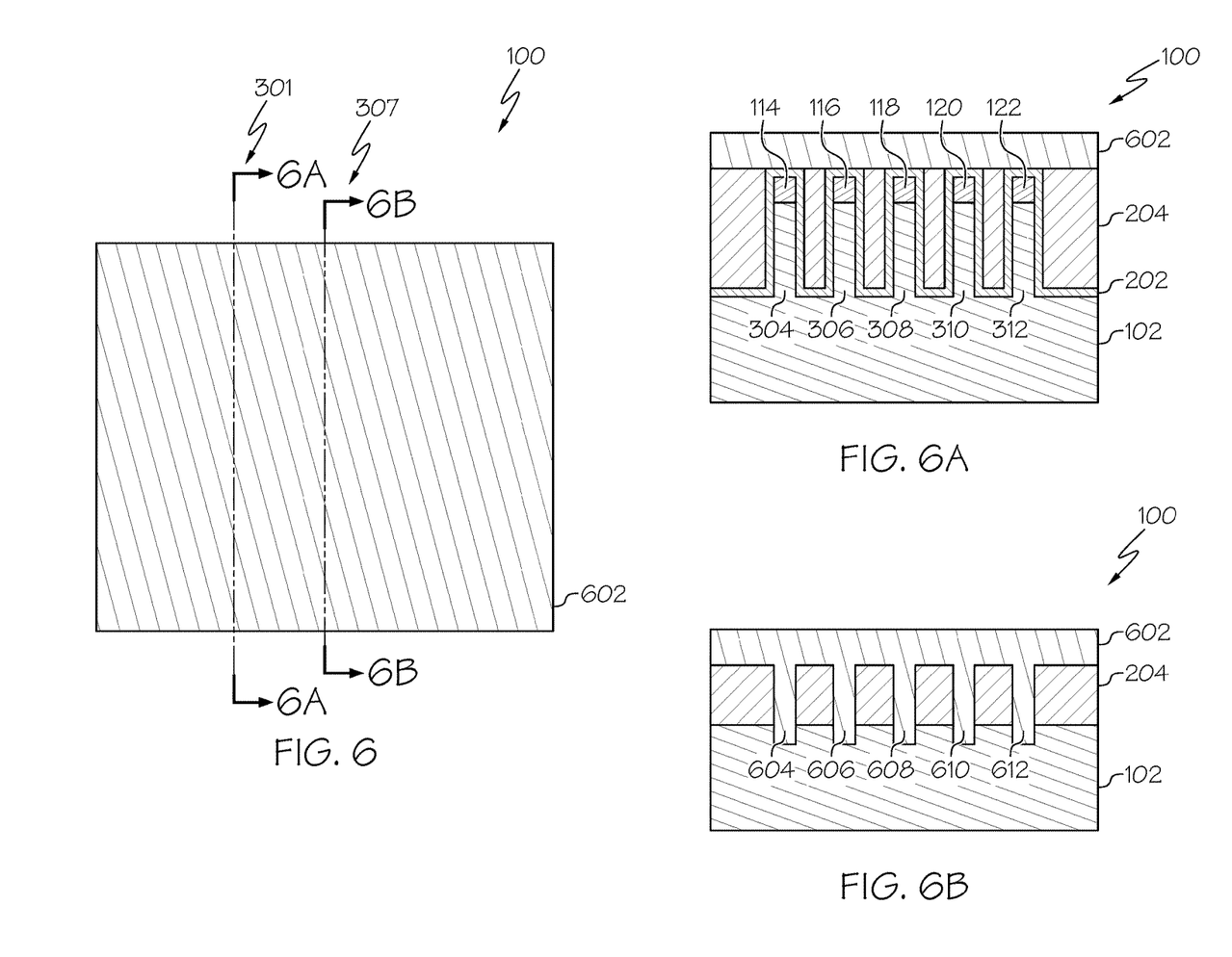
FIG. 6 is a top-down view of the semiconductor structure after a non-active fin structures have been formed in place of the dummy fin structures according one embodiment of the present invention.
FIGS. 6A and 6B are cross-sectional views of the semiconductor structure after a nitride-based layer has been deposited over the structure, and non-active fin structures have been formed in place of the dummy fin structures according one embodiment of the present invention.

After the dummy fins 314 to 322 have been removed, a nitride-based layer 602 is then formed over the entire structure as shown in FIG. 6 to 6B using, for example, a CVD or ALD process. The nitride-based layer 602 may be formed by depositing a nitride-based material using a deposition process such as chemical vapor deposition (CVD) and/or atomic layer deposition (ALD). In one embodiment, the nitride-based layer/film 602 may comprise hydrofluoric acid resistant material such as SiBCN, SiCN, and/or the like. In one non-limiting example, the thickness of the nitride layer 602 is twice the step height difference between active fin and non-active fin. As shown in FIGS. 6 to 6B, the nitride-based layer 602 contacts the top surface of the STI liner 202 and a top surface of the STI material 204 in the active fin region(s) 301. FIGS. 6 to 6B further show that the hydrofluoric acid resistant nitride-based layer 602 contacts the top surface of the STI material 204 in the dummy fin region(s) 307 and fills the cavities 502 to 510, thereby forming nitride-based fins 604 to 612 (also referred to herein as "non-active fins 604 to 612") that replace the dummy fins 314 to 322.

Figure 7:
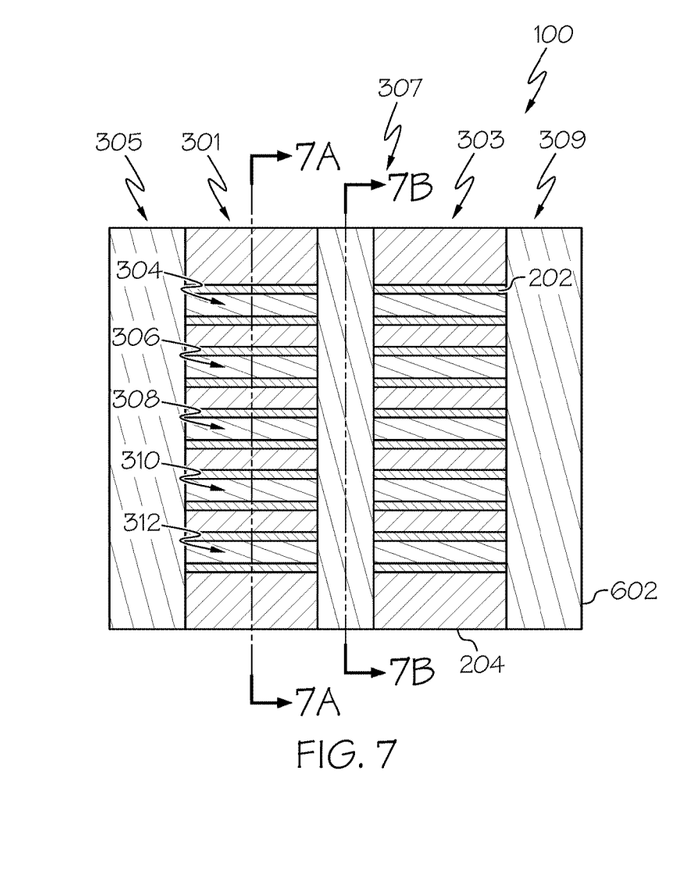
FIG. 7 is a top-down view of the semiconductor structure after the nitride-based layer has been removed from the active regions of the structure according one embodiment of the present invention.
Figure 7A:
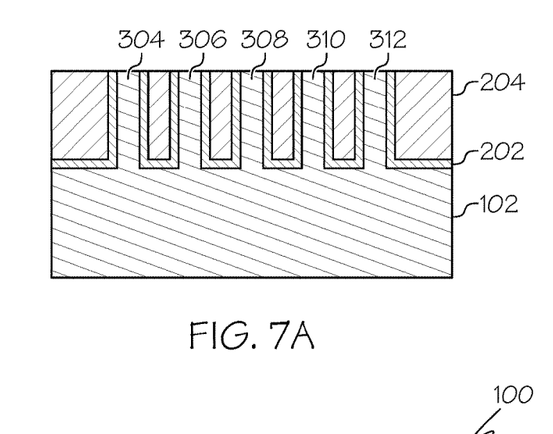
FIGS. 7A and 7B are cross-sectional views of the semiconductor structure after the nitride-based layer has been removed from the active regions of the structure according one embodiment of the present invention.
Figure 7B:
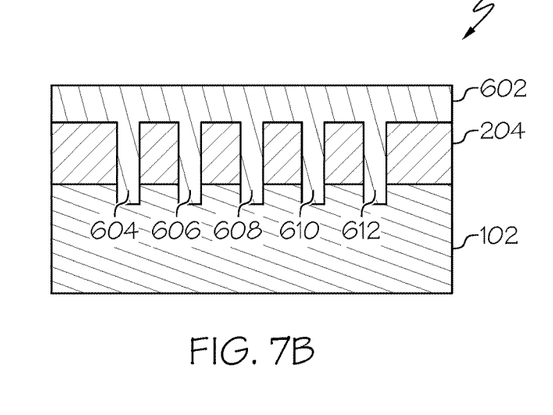

FIGS. 7 to 7B show that once the nitride-based layer 602 and fins 604 to 612 have been formed, the nitride-based layer 602 within the active fin regions 301, 303 of the structure are removed. In one embodiment, the nitride-based layer 602 is removed utilizing a CMP process. This process also stops on the top surface of the active fins 304 to 312, thereby removing the horizontal portion of the STI liner 202 from each fin. The nitride-based layer 602 in the dummy fin regions 305, 307, 309 remains untouched.

Figure 8:
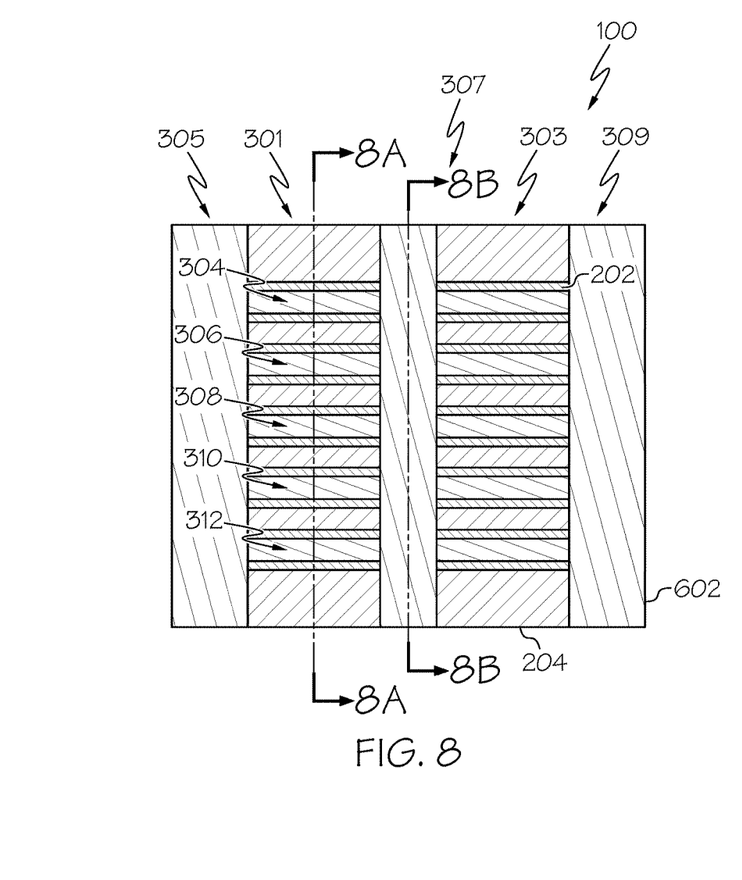
FIG. 8 is a top-down view of the semiconductor structure after a portion of the active fin structures has been exposed according one embodiment of the present invention.
Figure 8A:
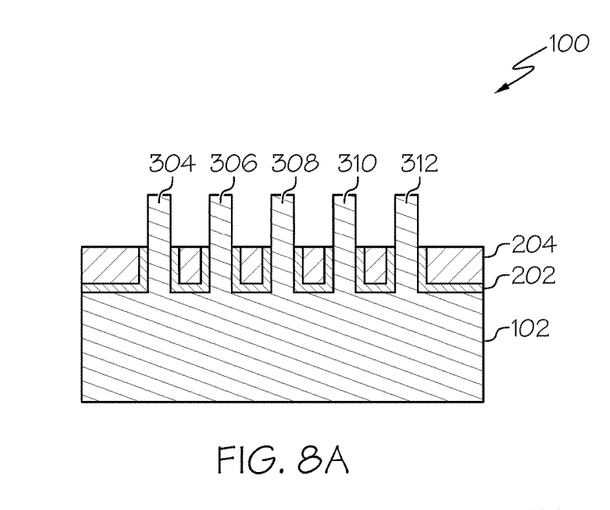
FIGS. 8A and 8B are cross-sectional views of the semiconductor structure after a portion of the active fin structures has been exposed according one embodiment of the present invention.
Figure 8B:
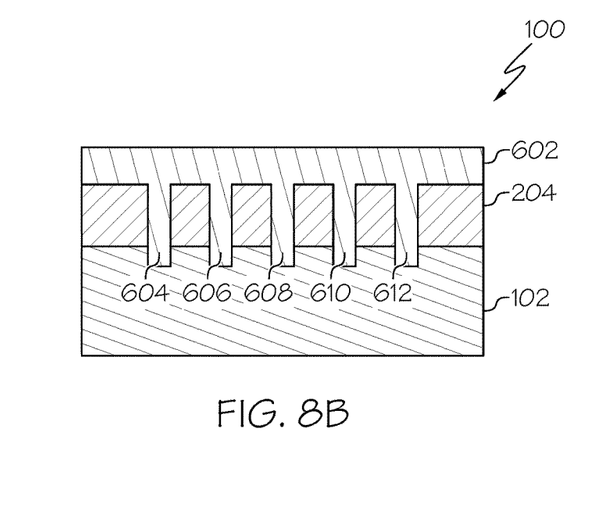

The STI material 204 within the active fin regions 301, 303 is then recessed below a top surface of the active fins 304 to 312, as shown in FIGS. 8 to 8B. The recessing process may be a dry etch such as, for example, COR (chemical oxide removal), or a wet chemical etch which may employ an aqueous solution containing hydrofluoric acid (HF). The STI liner 202 within the active fin regions 301, 303 is then etched back to be co-planar with the recessed STI material 204. A wet chemical etch having a chemistry comprising, for example, hydrofluoric ethylene glycol (HFEG) may be used to etch the STI liner 202. It should be noted that other processes and chemistries are applicable for etching/recessing the STI liner 202 and STI material 204 selective to the active fins 304 to 312. It should also be noted that the nitride-based layer 602 and fins 604 to 612 are resistant to the chemistries used for the above etching/recessing processes.

Figure 9:
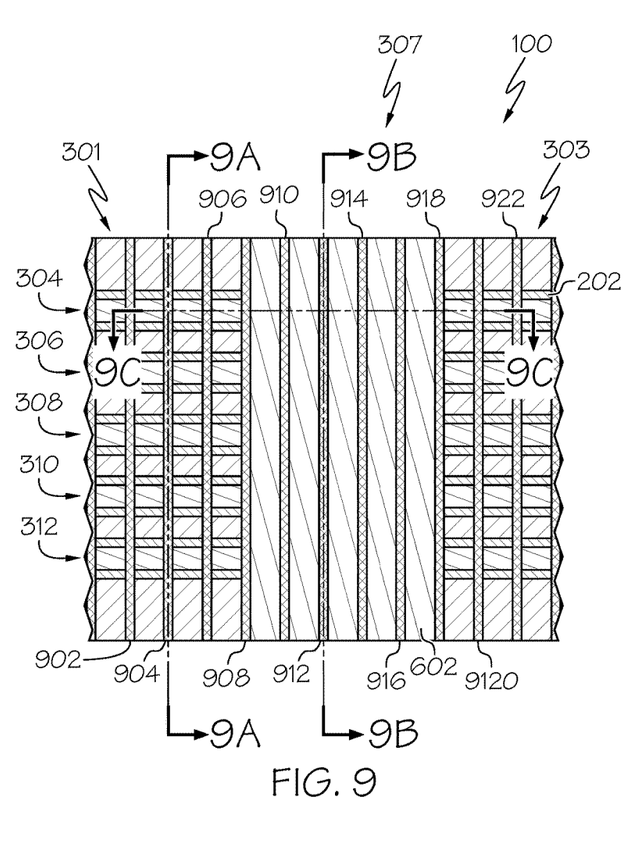
FIG. 9 is a top-down view of the semiconductor structure after gate structures have been formed according one embodiment of the present invention.
Figure 9A:
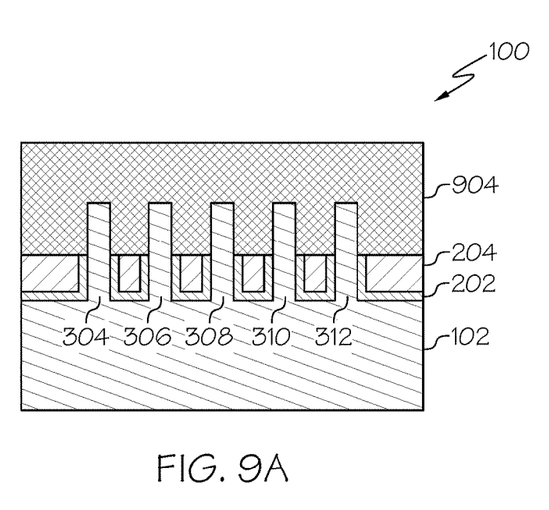
FIGS. 9A, 9B, and 9C are cross-sectional views of the semiconductor structure after gate structures have been formed according one embodiment of the present invention.
Figure 9B:
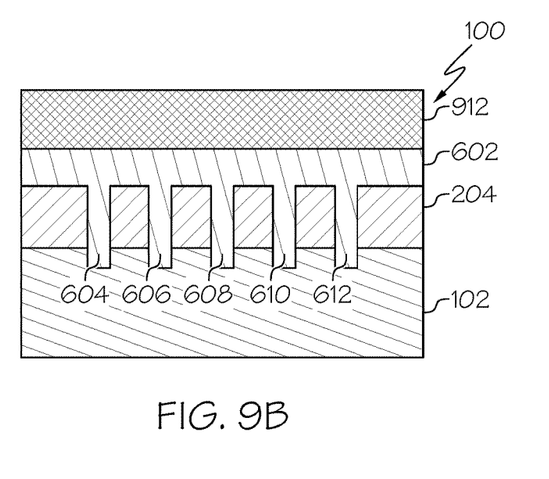
Figure 9C:
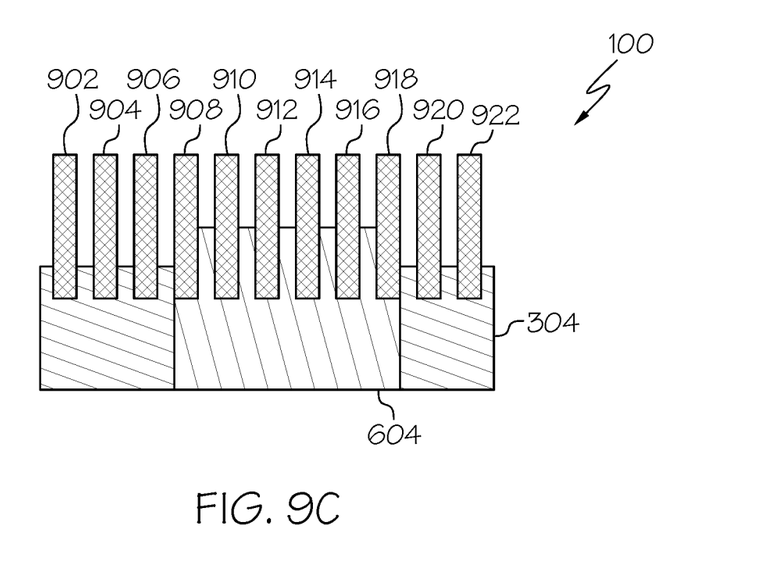

Gate structures 902 to 922 are then formed on the structure 100, as shown in FIG. 9. For example, gate materials may be deposited and patterned to form the gate structures 902 to 922. It should be noted that the gate structures 902 to 922 may be formed using a gate first process or a gate last process. In one embodiment, the gate structures 902 to 922 may comprise an insulating layer, an optional work-function layer, and a gate conductor. The insulating layer may be formed by depositing a thin conformal layer over the structure 100 by, for example, CVD, PECVD, or ALD. Excessive insulating layer material is removed, for example, by polishing such as chemically mechanical polishing (CMP) and/or etching to form a horizontal portion of the insulating layer in contact with the top surface of the STI material 204 in the active fin regions 301, 303 and horizontal portion of the insulating layer in contact with the top surface of the active fins 304 to 312, and vertical portions of the insulating layer in contact with sidewalls of the active fins 304 to 312. The insulating layer is further formed on and in contact with the top surface of the nitride-based layer 602 in the non-active fin regions 305, 307, 309 of the structure 100.

In one embodiment, the insulating layer may be a high-k dielectric layer. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The insulating layer may further include dopants such as lanthanum or aluminum.

The work-function layer may be formed by depositing a thin conformal layer over the structure 100 by, for example, CVD, PECVD, or ALD. Excessive interfacial layer material is removed, for example, by polishing such as chemically mechanical polishing (CMP) and/or etching to form a horizontal portion of the work-function layer in contact with the horizontal portion of the insulating layer in the active fin regions 301, 303, and vertical portions in contact with the vertical portions of the insulating layer in the active fin regions 301, 303. The work-function layer may also be formed in contact with the top surface of the insulating layer in the nitride-based fin regions 305, 307, 309 of the structure 100. The work-function layer may include one or more metals having a function suitable to tune the work function of finFETs. Examples of metals that can be employed in the work function metal layer include, but are not limited to La, Ti, and Ta. The thickness of the work-function layer can be from 3 nm to 15 nm, although lesser and greater thicknesses may also be employed.

The gate conductor may be formed, for example, by CVD, PECVD, or ALD and polishing away any excess material. The gate conductor fills the space between the vertical portions of the work-function layer in the active fin regions 301, 303, and contacts the horizontal and vertical portions of the work-function layer in the active fin regions 301, 303. The gate conductor further contacts the top surface of the work-function layer in the nitride-based fin regions 305, 307, 309 of the structure 100. In one embodiment, the gate conductor may include, for example, tungsten. The nitride-based layer 602 and non-active fins 604 to 612 mechanically interlock with the gate structures 902 to 922 at the fin-cut areas of the structure 100. This prevents gate collapse and floating gate issues in these areas. After the gate structures 902 to 922 have been formed, conventional fabrication process may be performed to complete the device(s).

Figure 10:
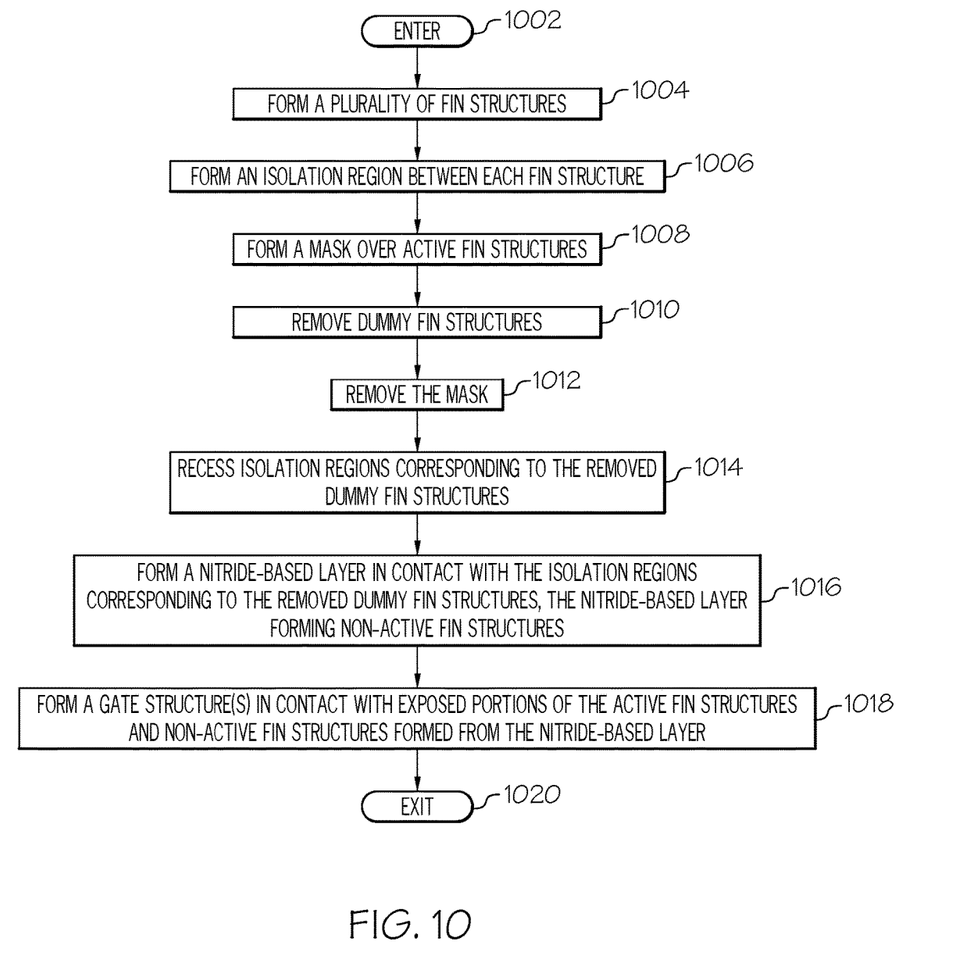
FIG. 10 is an operational flow diagram illustrating one process for forming a semiconductor structure after gate structures have been formed according one embodiment of the present invention.

FIG. 10 is an operational flow diagram illustrating one process for fabricating a semiconductor structure. It should be noted that each of the steps shown in FIG. 10 has been discussed in greater detail above with respect to FIGS. 1-9. In FIG. 10, the operational flow diagram begins at step 1002 and flows directly to step 1004. A plurality of fin structures, at step 1004, is formed on a substrate. An isolation region, at step 1006, is formed between each fin structure of the plurality of fin structures. Each isolation region comprises an isolation material. A mask, at step 1008, is formed active fin structures of the plurality of fin structures. Dummy fin structures of the plurality of fin structures remain exposed.

The dummy fin structures, at step 1010, are removed to form a plurality of trenches between the isolation regions corresponding to the non-active fin structures. The mask, at step 1012, is then removed. The isolation regions corresponding to the active fin structures, at step 1014, are recessed below a top surface of the active fin structures. The recessing exposes a portion of the active fin structures. A nitride-based layer, at step 1016, is formed in contact with the isolation regions corresponding to the dummy fin structures. The nitride-based layer forms a non-active fin structure within each trench of the plurality of trenches. A gate structure, at step 1018, is formed in contact with the exposed portion of the active fin structures, and the non-active fin structures formed from the nitride-based layer. The control flow then exits at step 1020.

Although specific embodiments of the invention have been disclosed, those having ordinary skill in the art will understand that changes can be made to the specific embodiments without departing from the spirit and scope of the invention. The scope of the invention is not to be restricted to the specific embodiments, and it is intended that the appended claims cover any and all such applications, modifications, and embodiments within the scope of the present invention.

It should be noted that some features of the present invention can be used in one embodiment thereof without use of other features of the present invention. As such, the foregoing description should be considered as merely illustrative of the principles, teachings, examples, and exemplary embodiments of the present invention, and not a limitation thereof.

Also, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A semiconductor structure comprising at least:
   a substrate;
   a plurality of active fin structures;
   a plurality of non-active fin structures;
   a first plurality of isolation regions in contact with the plurality of active fin structures;
   a second plurality of isolation regions, wherein the plurality of non-active fin structures is in contact with sidewalls of the second plurality of isolation regions, and wherein non-active fin material contacts a top surface of the non-active plurality of fin structures and the top surface of the second plurality of isolation regions;
   a first gate structure in contact with the plurality of active fin structures and the first plurality of isolation regions; and
   a second gate structure in contact with a top surface of the non-active fin material extending above a top surface of the second plurality of isolation regions, where the second gate structure is not in contact with the second plurality of isolation regions.

2. The semiconductor structure of claim 1, wherein the plurality of active fin structures and the plurality of non-active fin structures comprise different materials.

3. The semiconductor structure of claim 1, wherein the first plurality of isolation regions is recessed below a top surface of the plurality of active fin structures.

4. The semiconductor structure of claim 3, wherein the first plurality of isolation regions is further recessed below a top surface of the second plurality of isolation regions.

5. The semiconductor structure of claim 1, wherein the plurality of non-active fin structures is part of a non-active fin structure layer formed in contact with a top surface of the second plurality of isolation regions.

6. The semiconductor structure of claim 5, wherein the second gate structure is formed over and in contact with the non-active fin structure layer.

7. An integrated circuit comprising:
   a semiconductor structure, wherein the semiconductor structure comprises
      a substrate;
      a plurality of active fin structures;
      a plurality of non-active fin structures;
      a first plurality of isolation regions in contact with the plurality of active fin structures;
      a second plurality of isolation regions, wherein the plurality of non-active fin structures is in contact with sidewalls of the second plurality of isolation regions, and wherein non-active fin material contacts a top surface of the plurality of non-active fin structures and the top surface of the second plurality of isolation regions;

a first gate structure in contact with the plurality of active fin structures and the first plurality of isolation regions; and a second gate structure in contact with a top surface of non-active fin material extending above a top surface of the second plurality of isolation regions, where the second gate structure is not in contact with the second plurality of isolation regions.

8. The integrated circuit of claim 7, wherein the plurality of active fin structures and the plurality of non-active fin structures comprise different materials.

9. The integrated circuit of claim 7, wherein the first plurality of isolation regions is recessed below a top surface of the plurality of active fin structures.

10. The integrated circuit of claim 9, wherein the first plurality of isolation regions is further recessed below a top surface of the second plurality of isolation regions.

11. The integrated circuit of claim 7, wherein the plurality of non-active fin structures is part of a non-active fin structure layer formed in contact with a top surface of the second plurality of isolation regions.

12. The integrated circuit of claim 11, wherein the second gate structure is formed over and in contact with the non-active fin structure layer.

* * * * *